United States Patent
Engl et al.

(10) Patent No.: US 8,653,540 B2
(45) Date of Patent: Feb. 18, 2014

(54) OPTOELECTRONIC SEMICONDUCTOR BODY AND METHOD FOR PRODUCING THE SAME

(71) Applicant: OSRAM Opto Semiconductors GmbH, Regensburg (DE)

(72) Inventors: Karl Engl, Pentling (DE); Patrick Rode, Regensburg (DE); Lutz Hoeppel, Alteglofsheim (DE); Matthias Sabathil, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 13/862,096

(22) Filed: Apr. 12, 2013

(65) Prior Publication Data
US 2013/0221392 A1 Aug. 29, 2013

Related U.S. Application Data

(63) Continuation of application No. 12/596,170, filed as application No. PCT/DE2008/000702 on Apr. 24, 2008, now Pat. No. 8,450,751.

(30) Foreign Application Priority Data

Apr. 26, 2007 (DE) .......................... 10 2007 019 773
May 16, 2007 (DE) .......................... 10 2007 022 947

(51) Int. Cl.
*H01L 27/15* (2006.01)
*H01L 31/12* (2006.01)
*H01L 33/00* (2010.01)

(52) U.S. Cl.
USPC .................................... 257/81; 257/E33.066

(58) Field of Classification Search
USPC .................. 257/81, 91, 93, 99, 774, E33.062, 257/E33.066
See application file for complete search history.

(56) References Cited

U.S. PATENT DOCUMENTS

| 3,739,217 | A | 6/1973 | Bergh et al. |
| 5,684,309 | A | 11/1997 | McIntosh et al. |

(Continued)

FOREIGN PATENT DOCUMENTS

| CA | 2 360 502 A1 | 5/2001 |
| DE | 44 43 424 A1 | 6/1995 |
| DE | 43 36 891 C2 | 11/1996 |

(Continued)

OTHER PUBLICATIONS

Schnitzer, I., et al., "30 % External Quantum Efficiency from Surface Textured, Thin-Film Light-Emitting Diodes", Applied Physics Letters, Oct. 18, 1993, pp. 2174-2176, vol. 63, No. 16, 1993 American Institute of Physics.

*Primary Examiner* — William D Coleman
(74) *Attorney, Agent, or Firm* — Slater & Matsil, L.L.P.

(57) ABSTRACT

An optoelectronic semiconductor body includes a semiconductor layer sequence which has an active layer suitable for generating electromagnetic radiation, and a first and a second electrical connecting layer. The semiconductor body is provided for emitting electromagnetic radiation from a front side. The first and the second electrical connecting layer are arranged at a rear side opposite the front side and are electrically insulated from one another by means of a separating layer. The first electrical connecting layer, the second electrical connecting layer and the separating layer laterally overlap and a partial region of the second electrical connecting layer extends from the rear side through a breakthrough in the active layer in the direction of the front side. Furthermore, a method for producing such an optoelectronic semiconductor body is specified.

17 Claims, 8 Drawing Sheets

(56) References Cited

U.S. PATENT DOCUMENTS

| | | |
|---|---|---|
| 5,831,277 A | 11/1998 | Razeghi |
| 5,889,295 A | 3/1999 | Rennie et al. |
| 5,905,276 A | 5/1999 | Manabe et al. |
| 6,018,167 A | 1/2000 | Oota |
| RE36,747 E | 6/2000 | Manabe et al. |
| 6,111,272 A | 8/2000 | Heinen |
| 6,172,382 B1 | 1/2001 | Nagahama et al. |
| 6,278,136 B1 | 8/2001 | Nitta |
| 6,281,524 B1 | 8/2001 | Yamamoto et al. |
| 6,340,824 B1 | 1/2002 | Komoto et al. |
| 6,849,881 B1 | 2/2005 | Harle et al. |
| 6,998,643 B2 | 2/2006 | Kim et al. |
| 7,109,527 B2 | 9/2006 | Illek et al. |
| 7,179,670 B2 | 2/2007 | Shelton et al. |
| 7,274,040 B2 | 9/2007 | Sun |
| 7,405,431 B2 | 7/2008 | Aoyagi et al. |
| 7,420,221 B2 | 9/2008 | Nagai |
| 7,446,341 B2 | 11/2008 | Bader et al. |
| 7,485,482 B2 | 2/2009 | Lee et al. |
| 7,671,377 B2 | 3/2010 | Kim et al. |
| 7,754,507 B2 | 7/2010 | Epler et al. |
| 7,964,881 B2 | 6/2011 | Choi et al. |
| 2001/0048276 A1 | 12/2001 | Rodriguez et al. |
| 2002/0017652 A1 | 2/2002 | Illek et al. |
| 2002/0053872 A1 | 5/2002 | Yang et al. |
| 2002/0117681 A1 | 8/2002 | Weeks et al. |
| 2002/0179914 A1 | 12/2002 | Sheu et al. |
| 2003/0057421 A1 | 3/2003 | Chen |
| 2003/0116771 A1 | 6/2003 | Wirth |
| 2003/0123505 A1 | 7/2003 | Peters et al. |
| 2003/0168664 A1 | 9/2003 | Hahn et al. |
| 2003/0189201 A1 | 10/2003 | Chen |
| 2003/0230754 A1 | 12/2003 | Steigerwald et al. |
| 2004/0080011 A1 | 4/2004 | Starikov et al. |
| 2004/0184498 A1 | 9/2004 | Ueki |
| 2004/0217360 A1 | 11/2004 | Negley |
| 2004/0256631 A1 | 12/2004 | Shin |
| 2005/0001223 A1 | 1/2005 | Linder et al. |
| 2005/0056855 A1 | 3/2005 | Lin et al. |
| 2005/0139840 A1 | 6/2005 | Lai et al. |
| 2005/0156177 A1 | 7/2005 | Lin et al. |
| 2006/0001032 A1 | 1/2006 | Murofushi et al. |
| 2006/0033113 A1 | 2/2006 | Lee et al. |
| 2006/0091409 A1 | 5/2006 | Epler et al. |
| 2006/0108593 A1 | 5/2006 | Kim et al. |
| 2006/0113548 A1 | 6/2006 | Chen et al. |
| 2006/0163586 A1 | 7/2006 | Denbaars et al. |
| 2006/0180820 A1 | 8/2006 | Illek et al. |
| 2007/0096130 A1 | 5/2007 | Schiaffino et al. |
| 2007/0114557 A1 | 5/2007 | Shelton et al. |
| 2007/0176188 A1 | 8/2007 | Tanaka et al. |
| 2007/0246716 A1 | 10/2007 | Bhat et al. |
| 2007/0272939 A1 | 11/2007 | Peng |
| 2007/0295985 A1 | 12/2007 | Weeks, Jr. et al. |
| 2008/0048193 A1 | 2/2008 | Yoo et al. |
| 2008/0142780 A1 | 6/2008 | Bader et al. |
| 2008/0191215 A1 | 8/2008 | Choi et al. |
| 2008/0237622 A1 | 10/2008 | Choi et al. |
| 2008/0277674 A1 | 11/2008 | Nagai et al. |
| 2008/0308823 A1 | 12/2008 | Kamii et al. |
| 2009/0065800 A1 | 3/2009 | Wirth et al. |
| 2009/0101923 A1 | 4/2009 | Choi et al. |
| 2010/0230698 A1 | 9/2010 | Rode et al. |
| 2010/0276706 A1 | 11/2010 | Herrmann |

FOREIGN PATENT DOCUMENTS

| | | |
|---|---|---|
| DE | 197 57 850 A1 | 7/1998 |
| DE | 100 17 336 A1 | 10/2001 |
| DE | 100 17 337 A1 | 10/2001 |
| DE | 100 26 255 A1 | 11/2001 |
| DE | 101 18 447 C2 | 3/2003 |
| DE | 101 47 886 A1 | 4/2003 |
| DE | 101 59 695 A1 | 6/2003 |
| DE | 101 62 914 A1 | 7/2003 |
| DE | 102 44 986 A1 | 4/2004 |
| DE | 10 2004 01229 A1 | 6/2005 |
| DE | 10 2005 007 601 A1 | 9/2005 |
| DE | 10 2005 016 592 A1 | 11/2005 |
| DE | 10 2004 050 891 A1 | 4/2006 |
| DE | 10 2007 030 129 A1 | 1/2009 |
| DE | 10 2008 021 403 A1 | 4/2009 |
| EP | 0 905 797 A2 | 3/1999 |
| EP | 0 977 277 A1 | 2/2000 |
| EP | 1 020 935 A2 | 7/2000 |
| EP | 1 577 958 A1 | 9/2005 |
| JP | 03-177080 A | 8/1991 |
| JP | 05-136458 A | 6/1993 |
| JP | 09-008403 A | 1/1997 |
| JP | 09-293936 A | 11/1997 |
| JP | 10-004209 A | 1/1998 |
| JP | 10-041586 A | 2/1998 |
| JP | 1 1-251 644 A | 9/1999 |
| JP | 2000-174333 A | 6/2000 |
| JP | 2001-244503 A | 9/2001 |
| JP | 2002-246648 A | 8/2002 |
| JP | 2003-017757 A | 1/2003 |
| JP | 2003-224297 A | 8/2003 |
| JP | 2004-311677 A | 11/2004 |
| JP | 2005-197289 A | 7/2005 |
| JP | 2005-322722 A | 11/2005 |
| JP | 2005-535143 A | 11/2005 |
| JP | 2006-049855 A | 2/2006 |
| JP | 2006-086300 A | 3/2006 |
| JP | 2006-108698 A | 4/2006 |
| JP | 2006-269807 A | 10/2006 |
| JP | 2007-123613 A | 5/2007 |
| JP | 2007-157926 A | 6/2007 |
| JP | 2007-201317 A | 8/2007 |
| KR | 10-2000-0024945 A | 5/2000 |
| KR | 10-2003-0017462 A | 3/2003 |
| KR | 10-2004-0010168 A | 1/2004 |
| KR | 10-2004-0073434 A | 8/2004 |
| KR | 10-2005-0064646 A | 6/2005 |
| KR | 10-2005-0075968 A | 7/2005 |
| KR | 10-2005-0096741 A | 10/2005 |
| KR | 10-2005-0119693 A | 12/2005 |
| KR | 10-2006-0007893 A | 1/2006 |
| KR | 10-2006-0010527 A | 2/2006 |
| KR | 10-2006-0059783 A | 2/2006 |
| KR | 10-2006-0062715 A | 6/2006 |
| KR | 10-2006-0064460 A | 6/2006 |
| KR | 10-2006-0108882 A | 10/2006 |
| KR | 10-2006-0115741 A | 11/2006 |
| KR | 10-2007-0008602 A | 1/2007 |
| KR | 10-2007-0021876 A | 2/2007 |
| KR | 10-2007-0072826 A | 7/2007 |
| WO | WO 00/65665 A1 | 11/2000 |
| WO | WO 01/47039 A1 | 6/2001 |
| WO | WO 02/13281 A1 | 2/2002 |
| WO | WO 2005/091848 A2 | 10/2005 |
| WO | WO 2006/006555 A1 | 1/2006 |
| WO | WO 2006/049855 A1 | 5/2006 |
| WO | WO 2006/098545 A2 | 9/2006 |
| WO | WO 2007/091704 A1 | 8/2007 |
| WO | WO 2008/047325 A2 | 4/2008 |

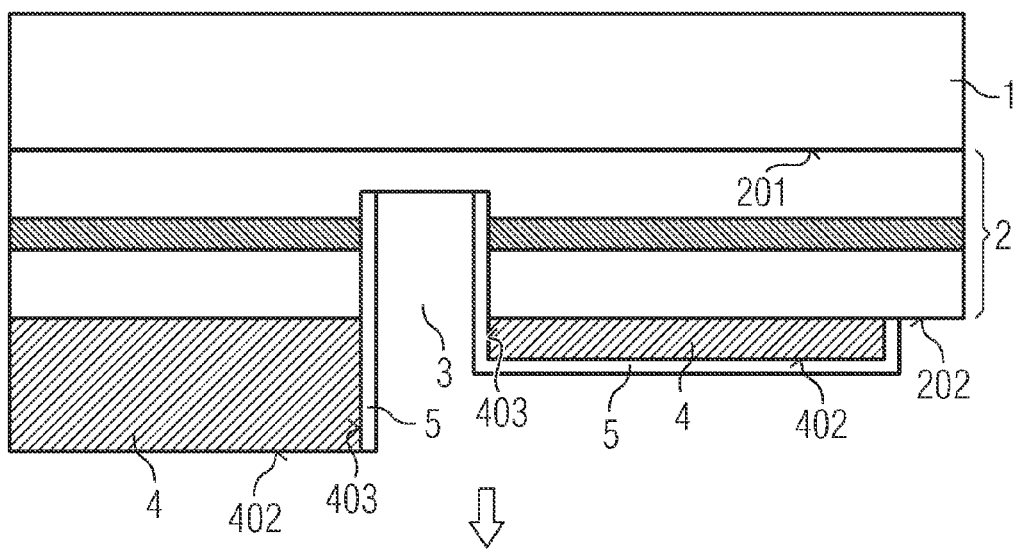
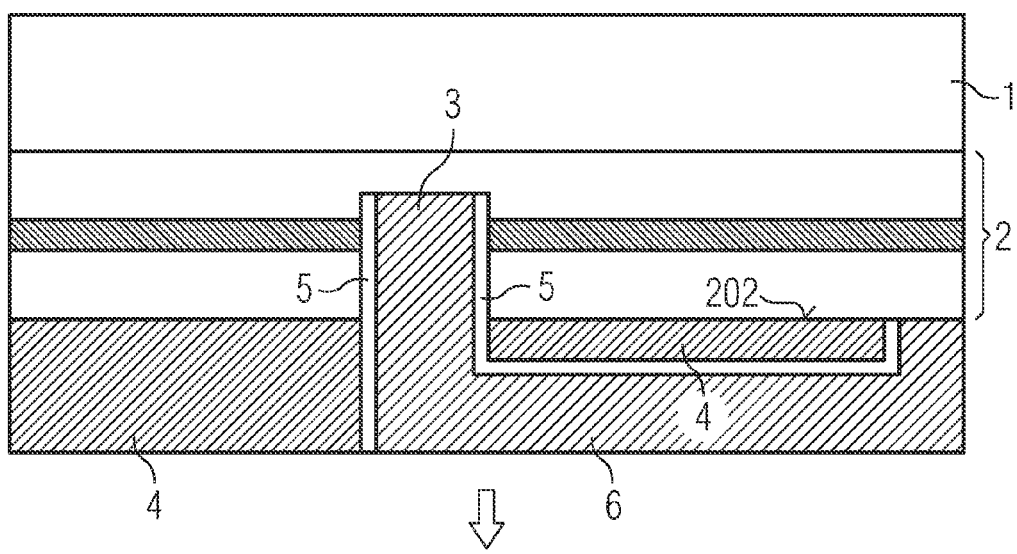

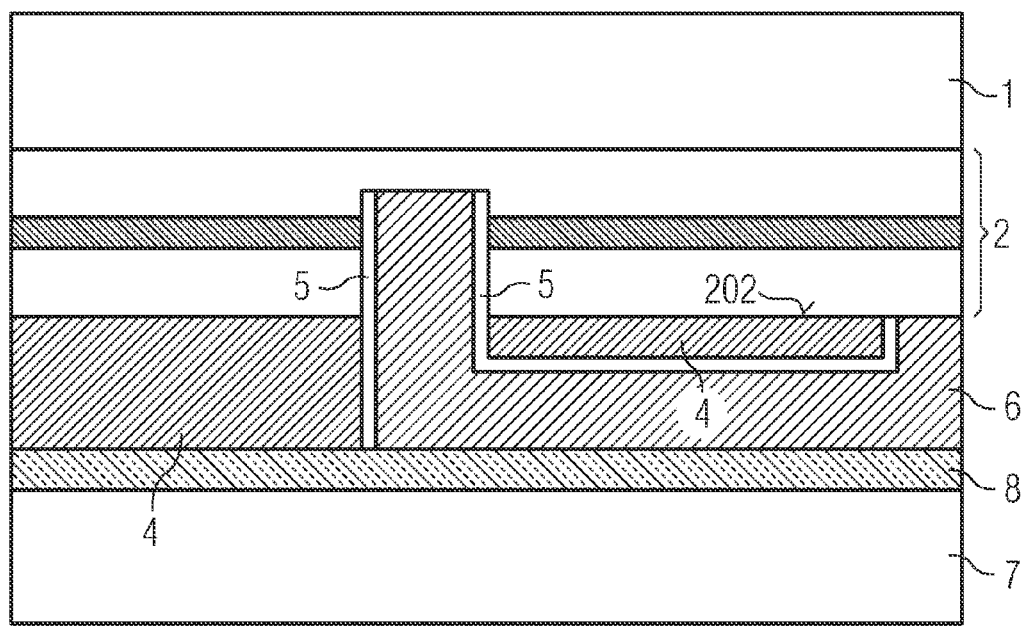
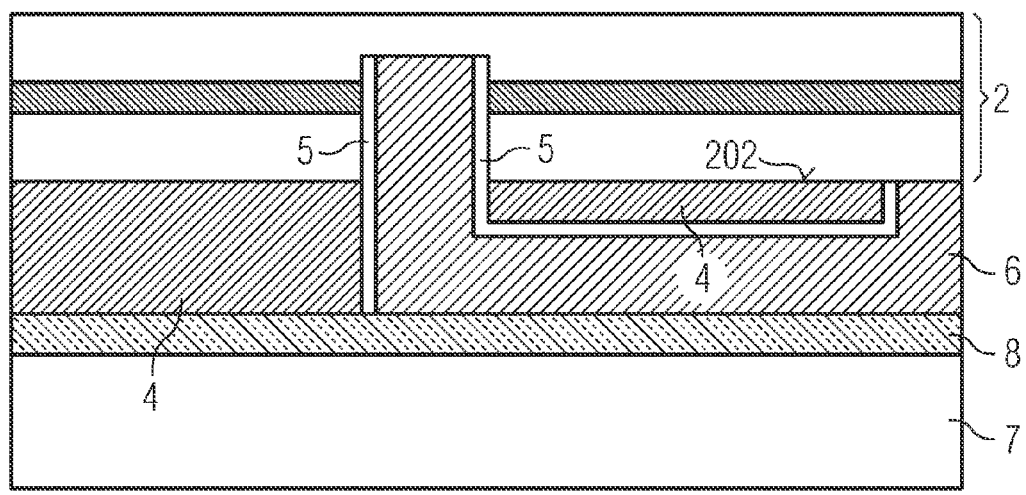

OPTOELECTRONIC SEMICONDUCTOR BODY AND METHOD FOR PRODUCING THE SAME

This is a continuation application of U.S. application Ser. No. 12/596,170, filed on Mar. 23, 2010, which is a national phase filing under section 371 of PCT/DE2008/000702, filed Apr. 24, 2008, which claims the priority of German patent applications 10 2007 019 773.1, filed Apr. 26, 2007, and 10 2007 022 947.1, filed May 16, 2007, all of which are incorporated herein by reference in their entirety.

BACKGROUND

The invention relates to an optoelectronic semiconductor body and to a method for producing an optoelectronic semiconductor body.

SUMMARY

In one aspect, the present invention specifies an optoelectronic semiconductor body having improved efficiency and/or improved electrical characteristics.

An optoelectronic semiconductor body according to the invention has a semiconductor layer sequence which contains an active layer suitable for generating electromagnetic radiation.

The active layer has a pn-junction, a double heterostructure, a single quantum well (SQW) or a multi quantum well (MQW) structure for generating radiation. In this context, the designation "quantum well structure" does not have any significance with regard to the dimensionality of the quantization. It thus comprises, inter alia, quantum wells, quantum wires and quantum dots and any combination of these structures. Examples of MQW structures are described in WO 01/39282 (U.S. Pat. No. 6,849,881), U.S. Pat. No. 5,831,277, U.S. Pat. No. 6,172,382 B1 and U.S. Pat. No. 5,684,309, which are all hereby incorporated by reference.

The semiconductor body is provided for emitting electromagnetic radiation from a front side. At a rear side opposite the front side, a first and a second electrical connecting layer are arranged. The first and the second electrical connecting layer are electrically insulated from one another by means of a separating layer.

In the present context, "arranged at a rear side opposite the front side" means that at least a part of the first or, respectively, second electrical connecting layer follows the semiconductor layer sequence in the direction from the front side to the rear side. However, it is not necessary that the entire first or, respectively, second electrical connecting layer is arranged at the rear side. Instead, a partial region of the second electrical connecting layer extends from the rear side through a breakthrough in the active layer in the direction of the front side. However, the first electrical connecting layer, the second electrical connecting layer and the separating layer are arranged in such a manner that they laterally overlap, particularly at the rear side.

In one embodiment of the semiconductor body, the first and/or the second electrical connecting layer reflect in the direction of the front side a part of the electromagnetic radiation which is emitted in the direction of the rear side by the active zone.

Advantageously, the light-emitting front side of the semiconductor layer sequence is free of electrical contact areas such as bond pads. The risk of shading and/or absorption of a part of the electromagnetic radiation, emitted by the active zone in operation, by the electrical contact areas is reduced in this manner. Elaborate method steps in conjunction with the production of such a contact area on the front side of the semiconductor layer sequence, for instance polishing of the front face of the semiconductor layer sequence and/or the production of metal webs for widening the current, which have a great thickness but little lateral extent, and/or measures which restrict the current injection into areas of the semiconductor layer sequence below the electrical contact area or prevent for instance the formation of an electrically insulating layer, of a Schottky barrier and/or of an ion-implanted area below the contact area, for example, can be advantageously omitted.

In a further development, the semiconductor body is a thin film light-emitting diode chip. In particular, it has at its rear side a carrier substrate. In one embodiment, the first and the second connecting layer are arranged between the semiconductor layer sequence and the carrier substrate at least in regions.

A thin film light-emitting diode chip is distinguished by at least one of the following characteristic features:

- the radiation-generating semiconductor layer sequence, which, in particular, is a radiation-generating epitaxial layer sequence, has a main face facing a carrier element, particularly the carrier substrate, on which a reflecting layer is applied or formed which reflects at least a part of the electromagnetic radiation generated in the semiconductor layer sequence back into it;
- the thin film light-emitting diode chip has a carrier element which is not the growth substrate on which the semiconductor layer sequence was epitaxially grown but a separate carrier element which was subsequently mounted on the semiconductor layer sequence;
- the semiconductor layer sequence has a thickness within a range of 20 µm or less, particularly within a range of 10 µm or less;
- the semiconductor layer sequence is free of a growth substrate. In the present text, "free of a growth substrate" means that a growth substrate, which is used for growth, if necessary, is removed from the semiconductor layer sequence or is at least greatly thinned. In particular, it is thinned in such a manner that it is not self-supporting alone or together with the epitaxial layer sequence. The remaining rest of the greatly thinned growth substrate is unsuitable as such, in particular, for the function of a growth substrate; and
- the semiconductor layer sequence contains at least one semiconductor layer with at least one surface which has an intermixing structure which, in the ideal case, leads to an approximately ergodic distribution of the light in the semiconductor layer sequence, that is to say, it has a scattering characteristic which is as ergodically stochastic as possible.

A basic principle of a thin-film light-emitting diode chip is described, for example, in I. Schnitzer, et al., Appl. Phys. Lett. 63 (16) Oct. 18, 1993, pages 2174-2176, which is hereby incorporated by reference. Examples of thin film light-emitting diode chips are described in EP 0905797 A2 (U.S. Pat. No. 6,111,272) and WO 02/13281 A1 (U.S. Pat. No. 7,109,527), which are also incorporated hereby by reference.

A thin film light-emitting diode chip is a good approximation of a Lambertian surface radiator and is therefore particularly well suited for application in a headlight, for instance, a motor vehicle headlight.

In a further embodiment, the semiconductor body has a semiconducting or electrically insulating mirror layer between the semiconductor layer sequence and the first and/or the second electric connecting layer, at least in places. A refractive index of the mirror layer deviates, for example, by one or more from the refractive index of a layer of the semiconductor layer sequence which follows the mirror layer in the direction towards the front side and, in particular, adjoins the mirror layer. In one embodiment, the mirror layer contains a dielectric such as $SiO_2$. In a further embodiment, the separating layer is formed as electrically insulating mirror layer at least in places.

In a development, the semiconducting or electrically insulating mirror layer contains a distributed Bragg reflector (DBR) which contains at least one pair of layers with alternating high and low refractive indices.

In one embodiment, the semiconducting or electrically insulating mirror layer covers 50 percent or more of a main face at the rear side of the semiconductor layer stack. In a further embodiment, the mirror layer has a plurality of openings through which partial regions of the first and/or the second electrical connecting layer extend to the semiconductor layer sequence.

The semiconducting or electrically insulating mirror layer has, for example, due to the change in refractive index, a particularly high reflection coefficient so that it reflects electromagnetic radiation emitted by the active zone in the direction of the rear side particularly efficiently in the direction of the front side. By means of a mirror layer which has a plurality of openings through which partial regions of the first and/or the second electrical connecting layer extend, the operating current is impressed particularly homogeneously into the semiconductor layer sequence.

In a further embodiment, the semiconductor layer sequence has a current spreading layer adjacent to the rear side. The current spreading layer contains, for example, a transparent conducting oxide (TCO). The homogeneity of the current impression is improved further by means of the current spreading layer.

In another embodiment, the first and/or the second electrical connecting layer has a multilayer structure. For example, the first and/or the second electrical connecting layer has an adhesion promoting layer, a reflector layer and/or a current distribution layer.

The adhesion promoting layer expediently is proximate to the semiconductor layer sequence. It preferably has a thickness of 1 nm or less, particularly of 0.5 nm or less. The adhesion promoting layer can be, for example, a monolayer and/or a non-closed layer of atoms and/or molecules. The reflector layer follows, in particular, the side of the adhesion promoting layer facing away from the semiconductor layer sequence and, in particular, adjoins the latter.

The adhesion promoting layer improves the adhesion of the reflector layer on a layer preceding the first or, respectively, second electrical connecting layer, particularly on a semiconductor layer of the semiconductor layer sequence, for instance, on the current spreading layer or the separating layer. Depending on the characteristics of the reflector layer, the adhesion promoting layer can also be omitted.

The adhesion promoting layer has, for example, platinum and/or titanium. The reflector layer comprises or consists of an electrically conductive material, particularly a metal with a high reflection coefficient, for example, silver.

In addition, the first and/or the second electrical connecting layer has in one development a current distribution layer which, in particular, contains a material having a particularly good electrical conductivity, for instance, gold.

In a further embodiment of the optoelectronic semiconductor body, the first electrical connecting layer has an electrical contact area, for instance a bond pad, which is suitable for electrically contacting the semiconductor body from its front side. In addition or as an alternative, it can have an electrical contact area which is suitable for electrically contacting the semiconductor body from its rear side. Analogously, the second electrical connecting layer can have a contact area which is suitable for electrically contacting the semiconductor body from its front side and/or an electrical contact area which is suitable for electrically contacting the semiconductor body at its rear side.

An electrical contact area which is suitable for electrically contacting the semiconductor body from its front side is expediently arranged on the side of the semiconductor layer sequence. The electrical contact areas can be advantageously arranged to have a large area since they do not impair the emission of electromagnetic radiation out of the semiconductor body. The semiconductor body is therefore particularly well suited to being used with high operating currents. In other words, it has the advantage of a high current carrying capacity.

The arrangement of the contact areas is advantageously freely selectable. The semiconductor body can be provided for contacting the p-side and for contacting the n-side of the semiconductor layer sequence from its front side, for contacting the p-side and the n-side from its rear side, for contacting the p-side from its front side and for connecting the n-side from its rear side, for contacting the n-side from its front side and for contacting the p-side from its rear side and for contacting the n- and/or p-side both from the front side and from the rear side. Contacting the p-side is established by means of the first electrical connecting layer and the contacting the n-side is established by means of the second electrical connecting layer or vice versa.

In a further embodiment, the semiconductor layer sequence has a buffer layer adjacent to the front side, which, in particular, has low electrical conductivity. For example, the buffer layer is undoped or weakly n-doped. In a development, the buffer layer is an ESD (electrostatic discharge) protection layer which reduces the risk of destruction of the semiconductor body by an electrostatic discharge.

In the present context, a buffer layer having a low electrical conductivity is understood to be a buffer layer which is not suitable for conducting an operating current to the active zone and the electrical conductivity of which is, for example, less than or equal to 20 $(\Omega cm)^{-1}$. In a development, the conductivity, also called specific conductance, is less than or equal to 1 $(\Omega cm)^{-1}$. In the present context, weak n-doping is understood to be n-doping of $2 \times 10^{17}$ atoms/$cm^3$ or less.

A method according to the invention for producing an optoelectronic semiconductor body has the following steps: epitaxial growing of a semiconductor layer sequence which has an active layer suitable for generating electromagnetic radiation and which is provided for emitting electromagnetic radiation from a front side, on a growth substrate; applying a first electrical connecting layer to a rear side, opposite to the front side, of the semiconductor layer sequence; forming a breakthrough in the active layer; forming a separating layer at the rear side of the semiconductor layer sequence; and applying a second electrical connecting layer to the rear side of the semiconductor layer sequence, wherein the first electrical connecting layer, the second electrical connecting layer and the separating layer are formed in a laterally overlapping fashion, a partial region of the second electrical connecting layer is formed in the breakthrough and the second electrical connecting layer is insulated from the first electrical connecting layer by means of the separating layer.

In an embodiment of the method, the first and/or the second electrical connecting layers are formed in a reflective fashion.

In a further development of the method, at least a part of the growth substrate is removed after the growth of the semiconductor layer sequence. The growth substrate can be removed before or after applying the first or the second connecting layer. For example, the part of the growth substrate is blast away, for instance by means of a laser lift-off method.

In another embodiment, a carrier substrate is arranged or formed at the rear side of the semiconductor body. The carrier substrate can be a separate carrier element which, for example, is connected to the semiconductor layer sequence by means of a soldering or bonding step by means of a solder or adhesive layer. As an alternative, the first and/or the second electrical connecting layer can represent the carrier substrate. For this purpose, the first and/or the second electrical connecting layer is, for example, reinforced galvanically.

In an embodiment of the method, a semiconducting or electrically insulating mirror layer is formed on the rear side of the semiconductor layer sequence in places. In a development of this embodiment, openings are formed in the semiconducting or electrically insulating mirror layer. This can already be done, for example, by means of a mask, when applying the minor layer. As an alternative, the openings can be formed after the application of the mirror layer in the latter, for example, by means of a lithographic process. The first and/or the second electrical connecting layer are suitably applied in such a manner that partial regions of the first and/or second electrical connecting layer extend through the openings in the mirror layer.

In another embodiment of the method, a current spreading layer which, in particular, contains a transparent conducting oxide, is applied on the rear side of the semiconductor layer sequence.

In a further embodiment, the epitaxial growing of the semiconductor layer sequence on the growth substrate comprises the growing of a buffer layer. The buffer layer is arranged, in particular, between the active layer and the growth substrate. It has, for example, a low electrical conductivity and is preferably undoped or weakly n-doped. In a development of the method, the buffer layer is exposed by removal of the growth substrate.

BRIEF DESCRIPTION OF THE DRAWINGS

Further advantages and advantageous embodiments result from the following exemplary embodiments described in conjunction with FIGS. 1 to 8, in which:

FIGS. 1A to 1G show schematical cross sections through an optoelectronic semiconductor body in various stages of a method of its production in accordance with a first exemplary embodiment;

In the exemplary embodiments and figures, similar or similarly acting components are provided with the same reference symbols. In principle, the figures and the size relationships of the elements shown in the figures are not be considered as true to scale. Instead, individual elements, for instance layers, can be represented excessively large or thick, respectively, to provide better understanding and/or for better representability.

DETAILED DESCRIPTION OF ILLUSTRATIVE EMBODIMENTS

FIGS. 1A to 1G show a method for producing an optoelectronic semiconductor body according to a first exemplary embodiment in schematical sectional views in different stages of the method.

Figure 1A:
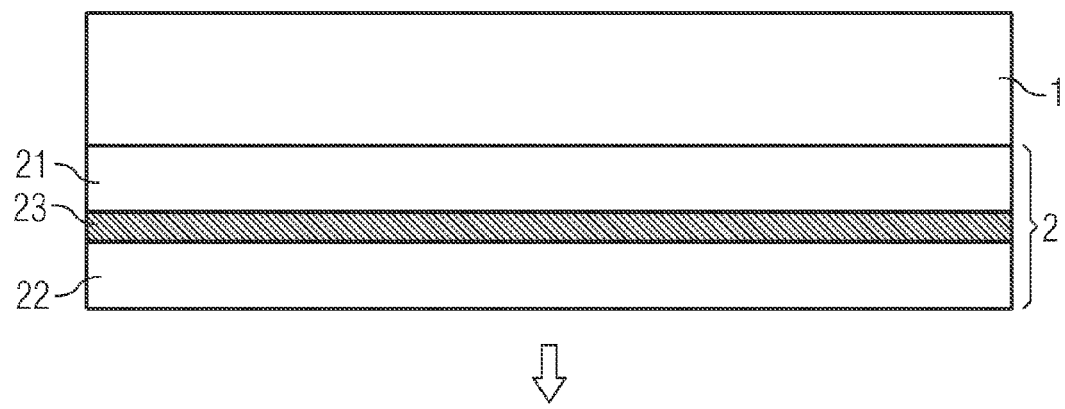

First, a semiconductor layer sequence 2 is epitaxially grown on a growth substrate 1 (see FIG. 1A). The semiconductor layer sequence 2 is based, for example, on a III/V compound semiconductor material or on a II/VI compound semiconductor material. The semiconductor layer sequence 2 has a thickness of between 5 and 7 μm in the present context.

A III/V compound semiconductor material has at least one element from the third main group such as, for example, Al, Ga, In and one element from the fifth main group such as, for example, B, N, P, As. In particular, the term "III/V compound semiconductor material" comprises the group of binary, ternary or quaternary compounds which contain at least one element from the third main group and at least one element from the fifth main group, particularly nitride and phosphide compound semiconductors. Such a binary, ternary or quaternary compound can also have, for example, one or more dopants and additional components. The III/V compound semiconductor materials include, for example, nitride III compound semiconductor material and phosphide III compound semiconductor material such as GaN, GaAs and InGaAlP.

Correspondingly, a II/VI compound semiconductor material has at least one element from the second main group such as, for example, Be, Mg, Ca, Sr and one element from the sixth main group such as, for example, O, S, Se. In particular, a II/VI compound semiconductor material comprises a binary, ternary or quaternary compound which comprises at least one element from the second main group and at least one element from the sixth main group. Such a binary, ternary or quaternary compound can also have, for example, one or more dopants and additional components. The II/VI compound semiconductor materials include, for example, ZnO, ZnMgO, CdS, CnCdS, MgBeO.

Semiconductor layer sequence 2 has an n-doped layer 21 which, in the present case, is adjacent to the growth substrate 1, and a p-doped layer 22. In the present case, the p-doped layer 22 is arranged at the side of the semiconductor layer sequence 2 facing away from the growth substrate 1. Between the n-doped layer 21 and the p-doped layer 22, the active zone 23 is arranged.

In one embodiment, the semiconductor layer sequence 2 is configured as an npn layer sequence in which a further n-doped layer is formed on the side of the p-doped layer 22 facing away from the n-doped layer 21. In another embodiment, the p-doped layer 22 is adjacent to the growth substrate 1 and the n-doped layer 21 faces away from the growth substrate 1.

In one variant of the method, a buffer layer (not shown in the figures) is applied, in particular, epitaxially grown, on the growth substrate 1 before growing the semiconductor layer sequence 2. The buffer layer brings about, for example, an adaptation of the lattice constants between the growth substrate 1 and a layer of the semiconductor layer sequence 2 subsequently grown on the buffer layer. In an expedient embodiment, the buffer layer is undoped or weakly n-doped. For example, the concentration of one or more n-dopants of the buffer layer is $2 \times 10^{17}$ atoms/cm$^3$ or less.

The undoped or weakly n-doped buffer layer is not suitable for being traversed by the operating current of the semiconductor body. However, this does not have a disadvantageous effect since the semiconductor body is not designed for being supplied with the operating current through the growth substrate 1 or from a side of the semiconductor layer stack 2 facing the growth substrate 1. Instead, the buffer layer in the completed semiconductor body reduces the risk that it will be damaged or destroyed by an electrostatic discharge.

Figure 1B:
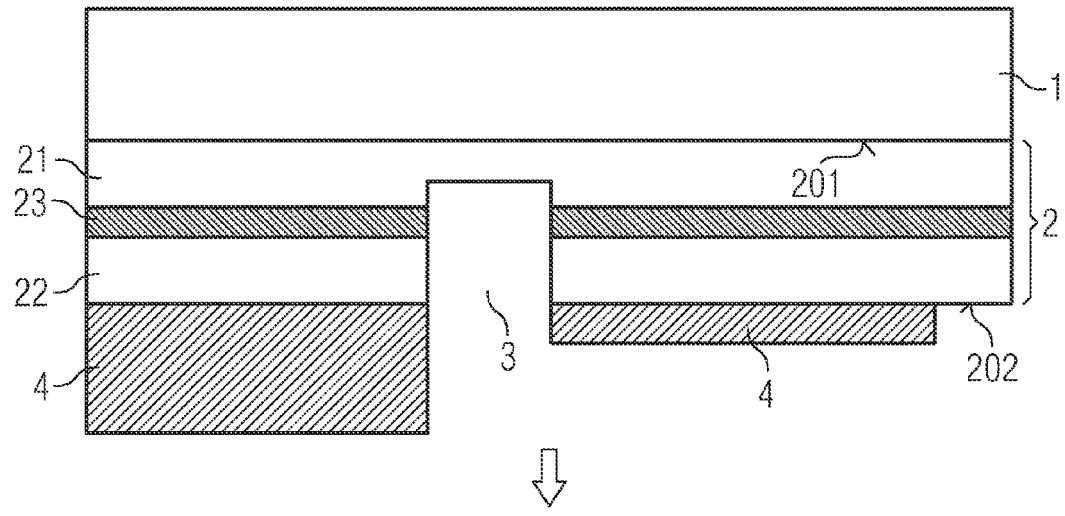

Subsequently, at least one breakthrough is formed in the active zone 23 (see FIG. 1B). For this purpose, an recess 3 is created in the semiconductor layer sequence 2, for example, by means of etching through a mask, starting from a second main face 202 of the semiconductor layer sequence 2. Preferably, a plurality of separate breakthroughs 3 is formed as a result of which a particularly homogeneous lateral current distribution is advantageously achieved.

The recess 3 extends from the second main face 202 in the direction of a first main face 201, opposite to the second main face 202, of the semiconductor layer sequence 2. The recess 3 has the form, for example, of a circular cylinder or of an elliptical cylinder, of a cube, of a cone or of a truncated cone, of a pyramid or of a truncated pyramid. As an alternative, the recess 3 can also have the form of a trench. The trench has preferably an essentially planar bottom face. In one embodiment, the cross section of the trench increases from the bottom face towards the second main face 202.

Before or after the formation of the recess 3, a first contact layer 4 is applied, for example, vapor-deposited on the second main face 202. The first contact layer 4 preferably has a material, particularly a metal, with a high reflection coefficient, for instance silver. The first contact layer 4 can have first partial regions and second partial regions, the layer thicknesses of which differ from one another. For example, the first partial regions have a lesser layer thickness than the second partial regions.

Subsequently, a separating layer 5 is formed on a part of the surface of the recess 3 and on a part of the surface of the first electrical connecting layer 4 (see FIG. 1C). For example, the separating layer 5 covers a annular side wall or side walls of the recess 3, at least in places, but preferably completely. The separating layer 5 expediently extends in the recess 3 from the second main face 202 at least to the active zone 23 and preferably to the bottom surface of the recess 3.

The separating layer 5 also suitably covers side faces 403 of the first electrical connecting layer 4 which are adjacent to the recess 3 and particularly adjoin the recess 3. In addition, the separating layer 5 in the present case covers the main face 402 of the first electrical connecting layer 4 in places, main face 402 being the main face remote from the semiconductor layer sequence 2. For example, the separating layer 5 covers the main face, facing away from the semiconductor layer sequence 2, of the thinner first partial regions of the first electrical connecting layer 4. The separating layer 5 is designed in an electrically insulating fashion and has, for example, a dielectric such as $SiO_2$, $SiN_x$ or SiON or consists thereof.

Subsequently, a second electrical contact layer 6 is produced as shown in FIG. 1D. A partial region of the second electrical contact layer 6 is arranged in the recess 3 and preferably fills it completely. Due to the lining of the side walls of the recess 3 with the separating layer 5, no short circuit of the active zone 23 occurs due to the partial region of the second electrical connecting layer 6 arranged in the recess 3.

In a top view of the second main face 202 of the semiconductor layer sequence 2, the second electrical connecting layer 6 covers the first electrical contact layer 4 in places. For example, the second electrical contact layer 6 extends, starting from the recess 3, over the first partial region or the first partial regions of the first electrical connecting layer 4 in the lateral direction towards an edge region of the semiconductor layer sequence 2. The separating layer 5 is arranged between the first and second electrical connecting layer 4, 6 so that no electrical short circuit occurs between the first and second electrical connecting layer 4, 6.

As shown in FIG. 1E, a carrier substrate 7 is subsequently attached at the rear side of the semiconductor layer sequence 2, facing away from the growth substrate 1, by means of a solder layer or adhesive layer 8 on the first and the second electrical connecting layer 4, 6. In the present arrangement, the adhesive layer 8 has a low electrical conductivity, in particular, it is electrically insulating. The carrier substrate has, for example, aluminum nitride or consists thereof. Other carrier substrates 7, which are, in particular, insulating, for instance glass carrier substrates are also conceivable.

It is also conceivable to produce the connection by means of an electrically conductive solder layer instead of with an adhesive layer. In this variant, the separating layer 5 is expediently also formed on the area of the first and/or second electrical connecting layer 4, 6 facing the carrier substrate 7.

In a subsequent method step (compare FIG. 1F), the growth substrate is thinned or completely removed. This can be done, for example, by means of a laser lift-off process known in principle to the person skilled in the art. For this purpose, the growth substrate 1 or the semiconductor layer sequence 2 preferably has a sacrificial layer which is decomposed when irradiated with laser radiation so that the growth substrate 1 is blast away. The irradiation with laser radiation is effected, for example, through the growth substrate 1.

Finally, the semiconductor layer sequence 2 is removed in places in order to expose electrical contact areas 41, 61 (see FIG. 1G) of the first and, respectively, second electrical connecting layer 4, 6. The removal is effected, for example, by means of an etching process, both dry etching processes and wet chemical etching processes being suitable.

Figure 1G:
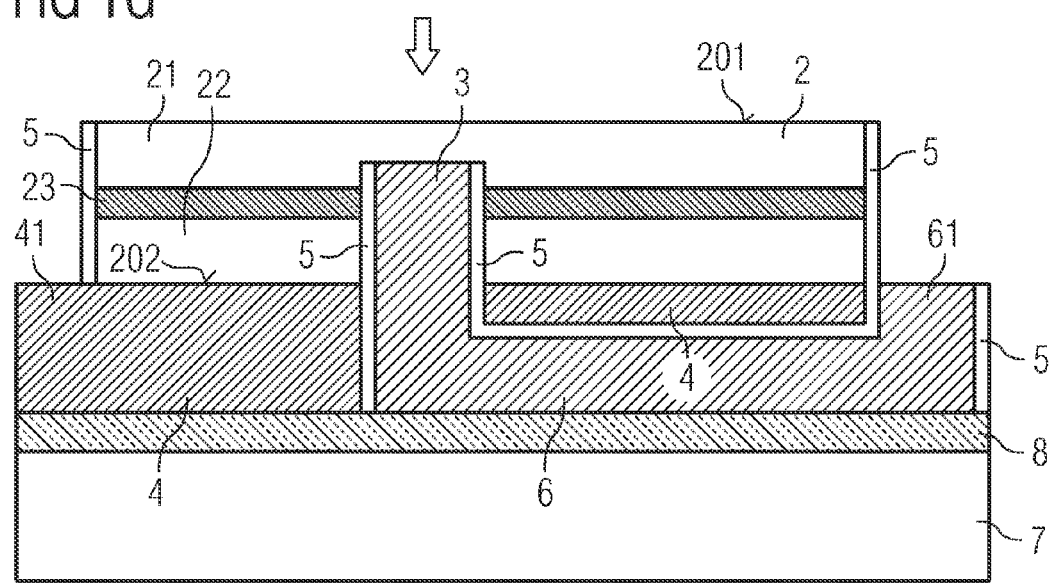

In a development of the method, the side flanks of the semiconductor layer sequence 2, of the first electrical connecting layer 4 and/or the second electrical connecting layer 6 are also covered with an electrically insulating layer 5 at least in places but preferably completely (see FIG. 1G).

The optoelectronic semiconductor body according to the first exemplary embodiment, shown in FIG. 1G, is provided for emitting electromagnetic radiation generated in operation by the active zone 23 through the first main face 201 of the semiconductor layer sequence 2 in the direction of its front side facing away from the carrier substrate 7. Electromagnetic radiation emitted by the active zone 23 in the direction of the rear side, that is to say in the direction of the second main face 202, is reflected back in the direction of the front side by the first electrical connecting layer 4, the second electrical connecting layer 6 and/or by the separating layer 5.

The operating current for operating the optoelectronic semiconductor body is impressed into the semiconductor layer sequence from the front side by the first electrical contact area 41 and the second electrical contact area 61. In the present arrangement, the electrical contact areas 41, 61 are arranged beside the semiconductor layer sequence 2.

The electrical contact areas 41, 61 are advantageously not located in the path of rays of the electromagnetic radiation emitted in the direction of the front side. At the same time, a particularly good thermal coupling to the carrier substrate 7 is achieved by means of the electrical connecting layers 4, 6 so that waste heat generated in operation of the semiconductor body is dissipated particularly efficiently from the semiconductor layer sequence 2.

The p-side of the semiconductor layer sequence 2 is contacted in the present case by means of the first electrical contact area 41 and the first electrical connecting layer 4. Contacting of the n-side is effected in the present case by means of the second electrical contact area 61 and the second electrical connecting layer 6. The n-side and the p-side of the semiconductor layer sequence 2, that is to say, in particular, the n-doped layer 21 and the p-doped layer 22 can also be exchanged.

Figure 5A:
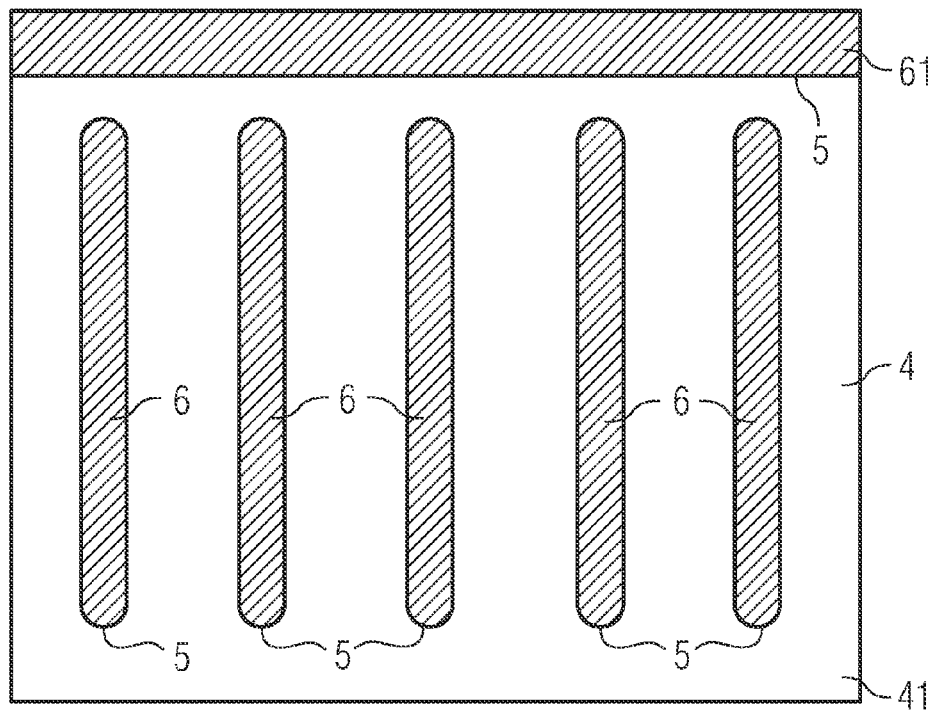
FIGS. 5A, 5B and 6 show schematical top views of various embodiments of electrical connecting layers.
Figure 5B:
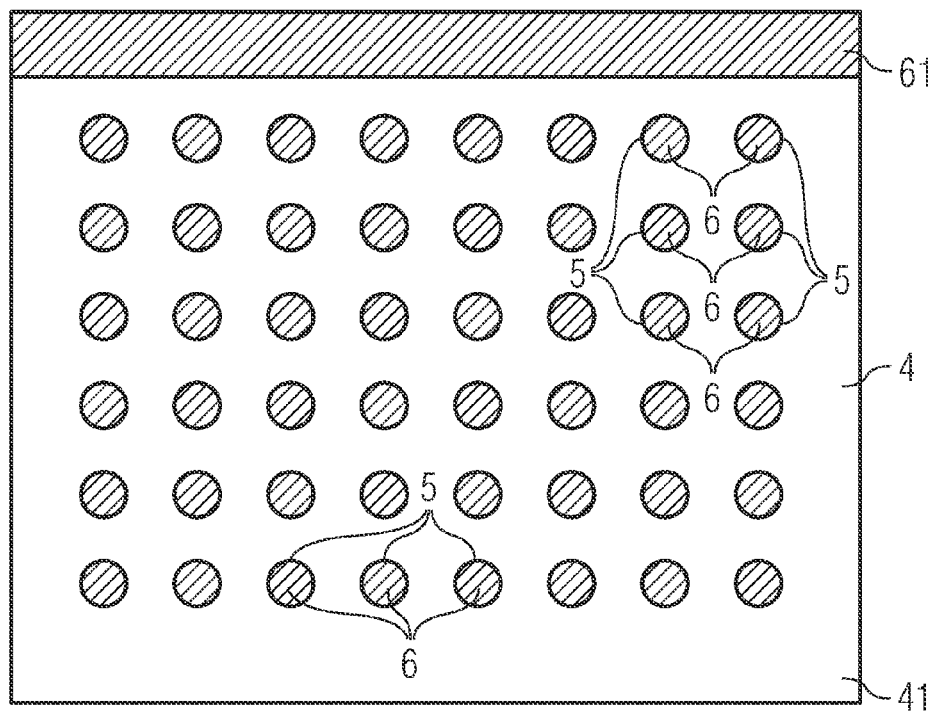

FIGS. 5A and 5B show various variants of the form of the breakthrough 3 through the active zone 23 in a schematical top view of the front side of the optoelectronic semiconductor body according to FIG. 1G. In this arrangement, the semiconductor layer sequence 2 is omitted to provide a simplified representation.

In the variant shown in FIG. 5A, the recesses 3 have the form of trenches, only one of which is shown in FIG. 1G to provide a simplified representation. The partial regions of the second electrical connecting layer 6 which extend through the breakthroughs 3 of the active layer 23 are strip-shaped in this variant. Apart from the breakthroughs 3, the first contact layer 4 establishes a full-area contact with the semiconductor layer sequence 2.

In the variant shown in FIG. 5B, the breakthroughs 3 are not trench-shaped but have the form of cylinders or truncated cones. Correspondingly, the partial regions of the second electrical connecting layer 6 extending through the breakthroughs 3 of the active layer 23 also have a circular cross section.

Both in the exemplary embodiment of FIG. 5A and in that of FIG. 5B, the electrical contact areas 41, 61 are strip-shaped and essentially extend over an entire side length of the semiconductor body.

Figure 2:
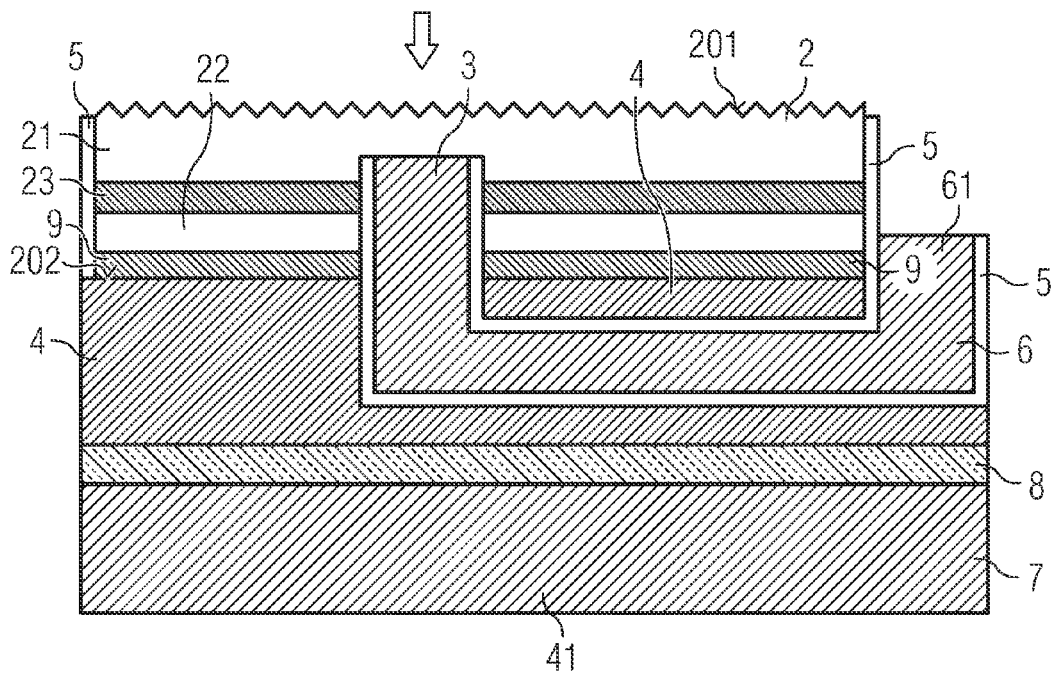
FIG. 2 shows a schematical cross section through an optoelectronic semiconductor body according to a second exemplary embodiment.

The second exemplary embodiment shown in FIG. 2 of an optoelectronic semiconductor body differs from the first exemplary embodiment in that the semiconductor layer sequence 2 has at its front side a roughening or structuring. For example, the first main face 201 is structured, for example, by means of pyramidal, conical, truncated-pyramidal and/or truncated-conical projections and/or indentations. The roughening or structuring preferably acts as diffuser for electromagnetic radiation emitted by the active zone 23. Such roughening is also suitable for the remaining exemplary embodiments in which no roughening is shown.

A further difference with respect to the first exemplary embodiment consists in that the semiconductor layer sequence 2 in the present case has a current distribution layer 9 on its rear side. The current spreading layer 9 preferably has a transparent conducting oxide, for example, indium tin oxide (ITO) or indium zinc oxide (IZO). For example, the current spreading layer is vapor deposited on the epitaxially grown semiconductor layers.

Advantageously, the homogeneity of the operating current impressed into the semiconductor layer sequence 2 in operation by means of the first electrical connecting layer 4 is increased further by means of the current spreading layer 9, which again is also suitable for the remaining exemplary embodiments. This may be appropriate, for example, if the p-doped layer 22 does not have an adequate transverse conductivity. Usually, the transverse conductivity of the n-doped layer 21 is higher than that of the p-doped layer 22. A current spreading layer adjoining the second electrical connecting layer 6 is therefore omitted in the present second exemplary embodiment.

Furthermore, in contrast to the first exemplary embodiment, the second electrical connecting layer 6 extends in places in the interior of the first electrical connecting layer 4 in the second exemplary embodiment according to FIG. 2. In other words, a first partial region of the first electrical connecting layer 4 is followed by a partial region of the second electrical connecting layer 6 and finally a further partial region of the first electrical connecting layer 4 in the direction from the front side towards the rear side of the optoelectronic semiconductor body.

For the production, for example, the first partial region of the first electrical connecting layer 4 is applied to the semiconductor layer sequence and provided with a separating layer 5, then the second electrical connecting layer is formed. This is done, in particular, analogously to the first exemplary embodiment (compare FIGS. 1C and 1D). Then a separating layer 5 is also applied to the second electrical connecting layer 6 before the first electrical connecting layer 4 is completed by forming the partial region following the second electrical connecting layer 6.

In such an embodiment, electromagnetic radiation which emerges out of the semiconductor layer sequence 2 via the separating layer 5 in the direction of the rear side is advantageously also reflected back at least partially into the semiconductor layer sequence 2 and thus in the direction of the front side. This further increases the efficiency of the semiconductor body.

Finally, the first electrical contact area 41, in the exemplary embodiment of FIG. 2, is not provided for contacting the semiconductor body from its front side. Instead, the optoelectronic semiconductor body according to the second exemplary embodiment has an electrically conductive carrier substrate 7 which, in the present case, is attached mechanically and electrically conductively on the first electrical connecting layer 4 with a solder layer 8 which has a soldering metal such as AuZn. An electrically conductive adhesive such as epoxy resin adhesive filled with silver is also suitable as material for the attachment layer 8. By means of the carrier substrate, the semiconductor body, its p-side in the present arrangement, can be contacted via the first electrical connecting layer 4 from its rear side. The second electrical contact area 61 is provided for contacting from the front side as in the first exemplary embodiment.

Figure 3:
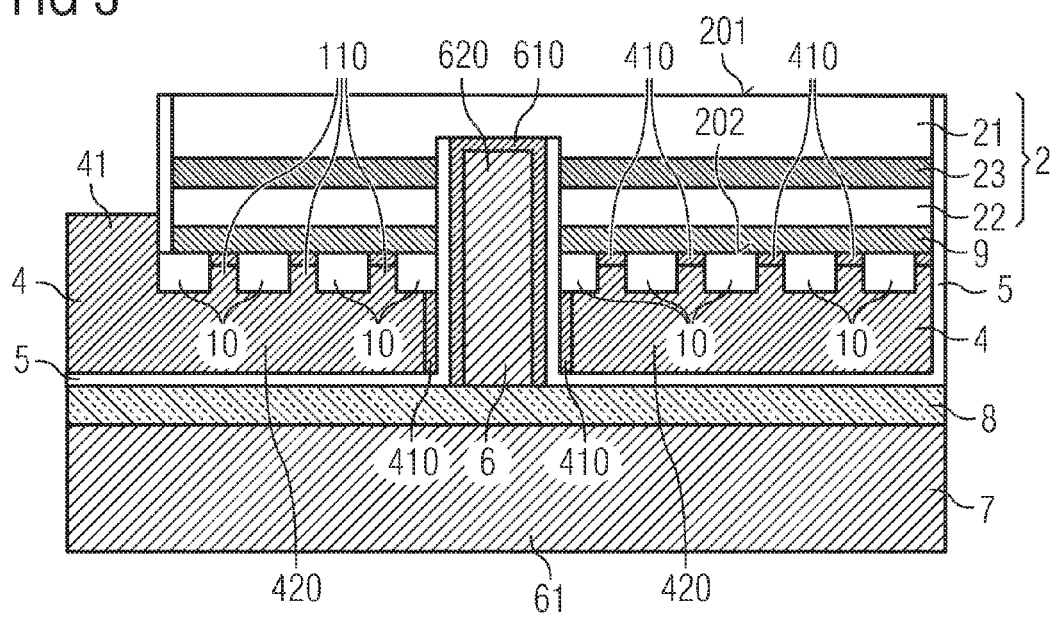
FIG. 3 shows a schematical cross section through an optoelectronic semiconductor body according to a third exemplary embodiment.

In the third exemplary embodiment shown in FIG. 3, the second electrical contact layer 6, instead of the first electrical contact layer, is electrically conductively connected to the carrier substrate 7. The first electrical contact layer 4 is electrically insulated from the electrically conductive carrier substrate 7 by means of the separating layer 5.

According to the third exemplary embodiment, the first and the second electrical contact layer 4, 6 have a reflector layer 410 or 610, respectively, which is adjacent to the semiconductor layer sequence 2 and contains a metal having a high reflection coefficient, for example, silver and a current distribution layer 420 or 620, respectively, which, for example, has gold.

By means of the reflector layer 410, 610, a particularly efficient reflection of electromagnetic radiation is achieved. With the current distribution layer 420, 620, a particularly low-loss feeding of the operating current to the semiconductor layer sequence 2 is achieved.

The reflector layer preferably has a thickness of between 50 nm and 200 nm, especially preferably between 100 nm and 140 nm, the boundaries in each case being included. The first and/or second electrical connecting layer 4, 6 can additionally have an adhesion promoting layer (not shown in the figures). The adhesion promoting layer has, for example, platinum or titanium and has, for example, a thickness of 0.1 nm. The reflector layer 410, 610 and the current distribution layer 420, 620 expediently follow the adhesion promoting layer in the direction from the front side towards the rear side.

In the present exemplary embodiment, a separate carrier substrate 7 is attached by means of an electrically conductive solder or adhesive layer 8 to a partial region of the separating layer 5 and on the second electrical connecting layer 6. As an alternative, however, the second electrical connecting layer 6 can also be formed as carrier substrate 7. The attachment layer 8 can then be omitted. For example, the second electrical connecting layer 6 is reinforced by means of galvanic deposition in such a manner that it represents a mechanically stable and particularly self-supporting carrier substrate 7. In this embodiment, the optoelectronic semiconductor body preferably has no further carrier substrate 7. Analogously, the first electrical connecting layer 4 can also be reinforced for forming a carrier substrate 7 in this or one of the other exemplary embodiments.

In a variant of the semiconductor body with reinforced first and/or second electrical connecting layer 4, 6, none of the two connecting layers is laterally brought out beyond the semiconductor layer sequence 2 in order to provide a connecting area at the front side. The semiconductor body then suitably has the first and the second contact area 41, 61 at its rear side. In this embodiment, the semiconductor body can have, as an alternative or additionally for reinforcing the first and/or second electrical connecting layer, also a carrier substrate 7 on its rear side which has the first and the second electrical contact area 41, 61 at its rear side.

A further difference between the optoelectronic semiconductor body according to the third exemplary embodiment and the semiconductor bodies according to the first two exemplary embodiments consists in that the semiconductor layer sequence 2 has on its rear side a semiconducting or electrically insulating mirror layer 10. The mirror layer 10 adjoins, in particular, the second main face 202 or is at least adjacent to it.

The mirror layer can contain a dielectric such as $SiO_2$. An index of refraction of the mirror layer and an index of refraction of a layer adjoining the second main face 202 or at least adjacent to it, of the semiconductor layer sequence 2 differ, in particular, by one or more. In the present case, the mirror layer 10 comprises a distributed Bragg reflector (DBR). The distributed Bragg reflector has at least one pair of layers with alternating high and low index of refraction. Bragg reflectors of dielectric layers are known in principle to the person skilled in the art and will not be explained in greater detail at this point, therefore. As an alternative to pairs of layers of dielectric layers, the Bragg reflector can also have pairs of layers of transparent conductive oxides such as ITO. A mirror layer 10 with a Bragg reflector with pairs of layers of transparent conductive oxides can be semiconducting or even electrically conductive. A particularly high reflectivity is achieved by means of the mirror layer 10.

For example, the first electrical connecting layer 4, the second electrical connecting layer 6 and possibly the mirror layer 10 reflect 80% or more, preferably 90% or more and particularly preferably 95% or more of the electromagnetic radiation emitted in the direction of the rear side by the active zone 23 back in the direction of the front side.

The mirror layer 10 preferably covers 50 percent or more of the second main face 202 of the semiconductor layer sequence 2. It has one or more openings 110 through which the first electrical connecting layer 4 extends. In the region of the openings 110, the first electrical connecting layer 4 is electrically conductively connected to the semiconductor layer sequence 2. The mirror layer 10 preferably has a plurality of openings 110 which can be arranged irregularly or regularly, for example, at lattice points of an imagined lattice. The dimensions of the openings 110 are preferably relatively small and then represent so-called joining contacts for the electrical contacting by means of the first electrical connecting layer 4.

Figure 6:
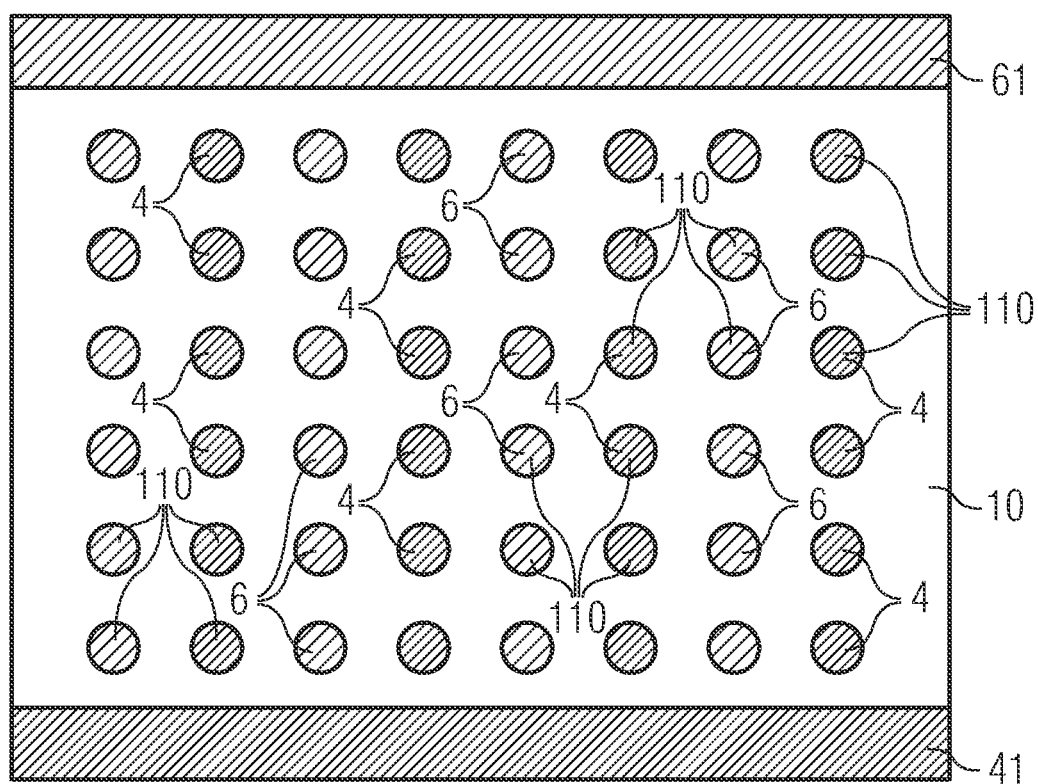

Such an embodiment is shown in FIG. 6 in a top view of the front side of the semiconductor body, wherein the semiconductor layer sequence 2 with the current distribution layer 9 has been omitted. In contrast to FIG. 3, the second electrical contact area 61 in FIG. 6 is not arranged at the rear side of the semiconductor body but, analogously to the first exemplary embodiment, provided for contacting the semiconductor body from its front side. The electrical contact areas 41, 61 in the present arrangement extend essentially over the entire side length of the semiconductor body.

The mirror layer 10 has a plurality of openings 110 which, in the present case, have a circular cross section. The openings 110 are arranged at the lattice points of an imaginary rectangular or square lattice. In first openings 110, partial regions of the first electrical connecting layer 4 are arranged. A partial region of the second electrical connecting layer 6 extends through second openings 110. The first and the second openings 110 are in each case arranged in columns in the present arrangement. Other arrangements are also conceivable.

In a development of this exemplary embodiment, which is also suitable for the other embodiments, the separating layer 5 is formed at least in places as an electrically insulating mirror layer 10 which, in particular, has a distributed Bragg reflector (DBR). For example, at least one part-piece of the separating layer 5, arranged in the recess 3 and/or adjoining it, is formed in this manner.

Figure 7:
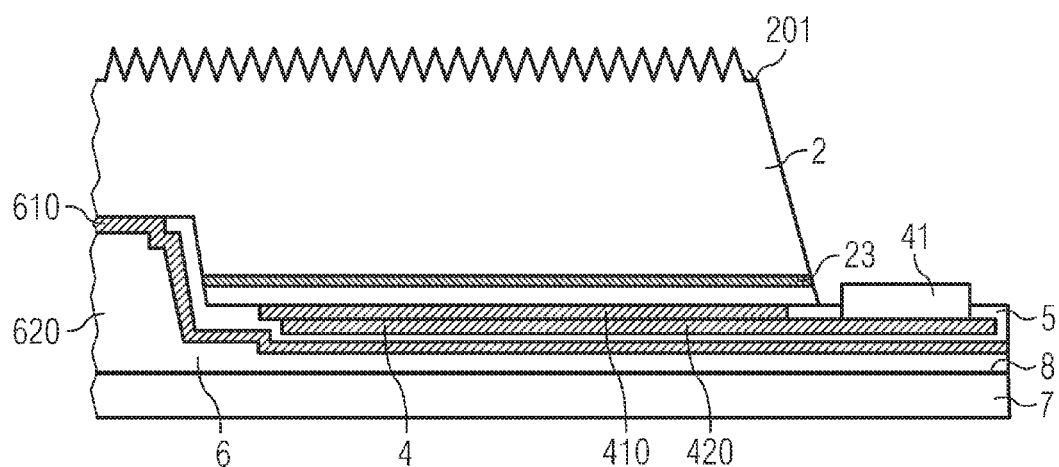
FIGS. 7 and 8 show schematical cross sections through partial regions of the optoelectronic semiconductor body according to the third exemplary embodiment.
Figure 8:
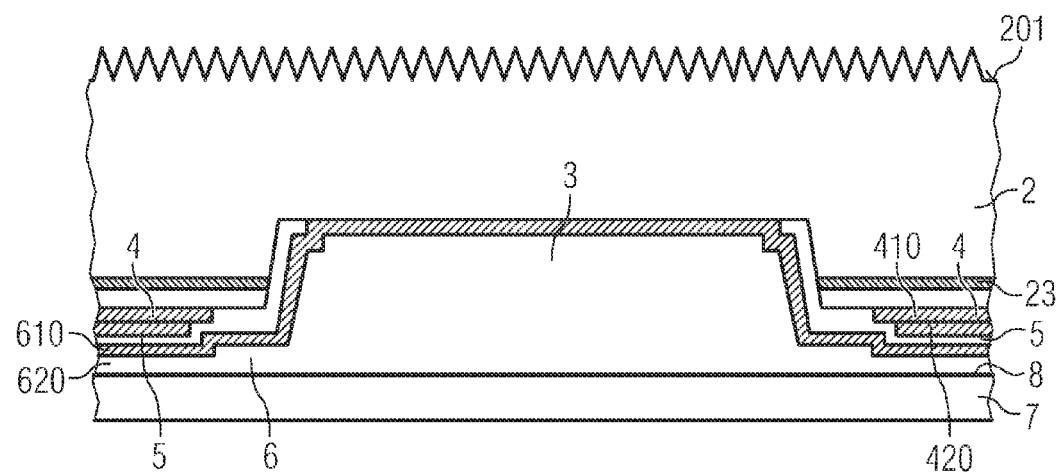

In FIGS. 7 and 8, sections of the optoelectronic semiconductor body of FIG. 3 are shown schematically, the current spreading layer 9 and the mirror layer 10 having been omitted for the purpose of simplified representation.

FIG. 7 shows an edge area of the semiconductor body with the first electrical contact area 41. The sectional representation is rotated by 180 degrees compared with FIG. 3 so that the first electrical contact area 41 is arranged at the right-hand side of FIG. 7. The first electrical contact area 41 is designed as a bond pad. During the production of the semiconductor body, for example, an opening is created for this purpose in the separating layer 5 after the removal of the edge area of the semiconductor layer sequence 2, and then the bond pad 41 is deposited in the opening.

FIG. 8 shows a schematical cross section of the trench-shaped recess 3, the side walls of which are covered by the separating layer 5.

Figure 4:
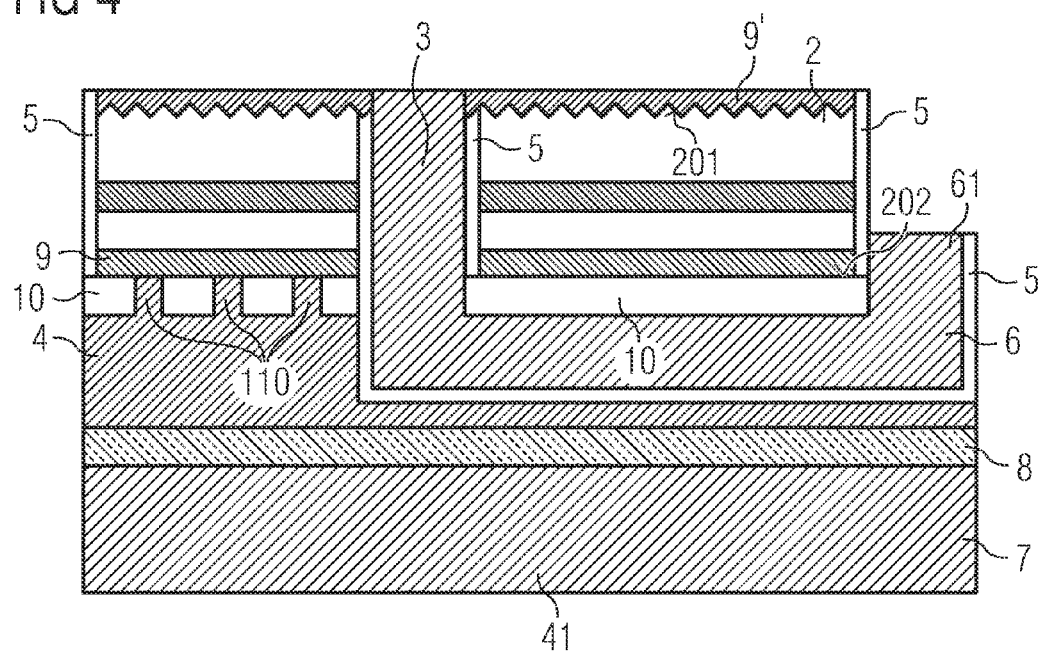
FIG. 4 shows a schematical cross section through an optoelectronic semiconductor body according to a fourth exemplary embodiment.

FIG. 4 shows a fourth exemplary embodiment of an optoelectronic semiconductor body. In contrast to the preceding exemplary embodiments, the breakthrough 3 through the active zone 23 is embodied as an breakthrough extending over the entire thickness of the semiconductor layer sequence 2 in this exemplary embodiment. The breakthrough 3 thus extends in the present arrangement from the first main face 201 to the second main face 202. The breakthrough thus represents a hole or a slot in the semiconductor layer sequence 2.

On the first main face 201, roughened in the present case, a further current spreading layer 9' is arranged, additionally to the current spreading layer 9 arranged on the rear side of the semiconductor rear sequence 2 in the present case. The further current spreading layer 9' also has, for example, a transparent conducting oxide such as ITO. By means of the further current spreading layer 9', a particularly homogeneous feeding of the operating current to the active zone 23 by means of the second electrical connecting layer 6 is achieved.

As in the third exemplary embodiment, the semiconductor body according to the fourth exemplary embodiment also has a mirror layer 10. In the present case, the mirror layer 10 is arranged as an alternative or additionally to the separating layer 5, between the second main face 202 of the semiconductor layer sequence 2 and the second electrical connecting layer 6.

Whilst the second electrical connecting layer 6 extends through a part area of the first electrical connecting layer 4 in the direction from the rear side to the front side in the first three exemplary embodiments, this is not the case in the fourth exemplary embodiment. In the fourth exemplary embodiment, the first connecting layer 4, in a top view of the rear side of the semiconductor body, covers the second connecting layer 6 at least in places.

The invention is not restricted to the exemplary embodiments by the description by means of these, but comprises any new feature and any combination of features which, in particular, includes any combination of features in the patent claims even if this feature or this combination itself it not explicitly specified in the patent claims or exemplary embodiments.

What is claimed is:

1. An optoelectronic semiconductor device comprising:
   a semiconductor body comprising a semiconductor layer sequence comprising an active layer suitable for generating electromagnetic radiation, and a first electrical connecting layer and a second electrical connecting layer;
   wherein the semiconductor body is provided for emitting electromagnetic radiation from a front side, the first and the second electrical connecting layers are arranged at a rear side opposite the front side and are electrically insulated from one another by a separating layer;
   wherein the first electrical connecting layer, the second electrical connecting layer, and the separating layer overlap laterally; and
   wherein a partial region of the second electrical connecting layer extends from the rear side through a breakthrough in the active layer in the direction of the front side, wherein the semiconductor layer sequence has a current spreading layer adjacent to the rear side, the current spreading layer comprising a transparent conducting oxide.

2. The optoelectronic semiconductor device according to claim 1, wherein the current spreading layer is a vapor deposited layer and disposed on the semiconductor layer sequence.

3. The optoelectronic semiconductor device according to claim 1, wherein the semiconductor layer sequence is free of a growth substrate.

4. The optoelectronic semiconductor device according to claim 1, further comprising a carrier substrate at the rear side of the semiconductor body, wherein the first and the second connecting layers are arranged between the semiconductor layer sequence and the carrier substrate at least in some regions under the semiconductor body.

5. The optoelectronic semiconductor device according to claim 1, wherein a mirror layer is arranged at least in places between the semiconductor layer sequence and the first and/or the second electrical connecting layer, the mirror layer has a plurality of openings and the first and/or the second electrical connecting layer extends through the openings to the semiconductor layer sequence.

6. The optoelectronic semiconductor device according to claim 1, wherein the first and/or the second electrically connecting layer has a multi-layer structure with an adhesion promoting layer, a reflector layer and/or a current distribution layer.

7. The optoelectronic semiconductor device according to claim 1, wherein the first electrical connecting layer has an electrical contact area which is suitable for electrically contacting the semiconductor body from its front side and/or the second electrical connecting layer has an electrical contact area which is suitable for electrically contacting the semiconductor body from its front side.

8. The optoelectronic semiconductor device according to claim 1, wherein the first and the second electrical connecting layers comprise an electrical contact area which is suitable for electrically contacting the semiconductor body from its rear side.

9. The optoelectronic semiconductor device according to claim 1, wherein the semiconductor layer sequence comprises a buffer layer arranged at the front side, wherein the buffer layer has a low electrical conductivity and is undoped or weakly n-doped.

10. An optoelectronic semiconductor device comprising a semiconductor body, the semiconductor body comprising:
    a semiconductor layer sequence comprising an active layer suitable for generating electromagnetic radiation, and a first electrical connecting layer, and a second electrical connecting layer;
    wherein the semiconductor body is provided for emitting electromagnetic radiation from a front side;
    wherein the first and the second electrical connecting layers are arranged at a rear side opposite the front side and are electrically insulated from one another using a separating layer;
    wherein the first electrical connecting layer, the second electrical connecting layer, and the separating layer overlap laterally;
    wherein a partial region of the second electrical connecting layer extends from the rear side through a breakthrough in the active layer in the direction of the front side; and
    wherein the first and the second electrical connecting layers comprise an electrical contact area which is suitable for electrically contacting the semiconductor body from its rear side.

11. The optoelectronic semiconductor device according to claim 10, wherein the semiconductor layer sequence is free of a growth substrate.

12. The optoelectronic semiconductor device according to claim 10, further comprising a carrier substrate at its rear side, wherein the first and the second connecting layers are arranged between the semiconductor layer sequence and the carrier substrate at least in some regions under the semiconductor body.

13. The optoelectronic semiconductor device according to claim 10, wherein a mirror layer is arranged at least in places between the semiconductor layer sequence and the first and/or the second electrical connecting layer, the mirror layer comprising a plurality of openings, and wherein the first and/or the second electrical connecting layer extends through the openings to the semiconductor layer sequence.

14. The optoelectronic semiconductor device according to claim 10, wherein the first and/or the second electrically connecting layer comprises a multi-layer structure with an adhesion promoting layer, a reflector layer and/or a current distribution layer.

15. The optoelectronic semiconductor device according to claim 10, the semiconductor layer sequence has a current spreading layer adjacent to the rear side, the current spreading layer containing a transparent conducting oxide.

16. The optoelectronic semiconductor device according to claim 10, wherein the semiconductor layer sequence has a buffer layer arranged at the front side, which buffer layer has a low electrical conductivity and is undoped or weakly n-doped.

17. The optoelectronic semiconductor device according to claim 15, wherein the current spreading layer is a vapor deposited layer disposed on the semiconductor layer sequence.

* * * * *